(12) United States Patent
Roh

(10) Patent No.: US 6,889,907 B2
(45) Date of Patent: May 10, 2005

(54) DATA INPUT METHOD FOR A HOLOGRAPHIC DIGITAL DATA STORAGE SYSTEM

(75) Inventor: Jae-Woo Roh, Seoul (KR)

(73) Assignee: Daewoo Electronics Corporation (KR)

( * ) Notice: Subject to any disclaimer, the term of this patent is extended or adjusted under 35 U.S.C. 154(b) by 133 days.

(21) Appl. No.: 10/229,637

(22) Filed: Aug. 27, 2002

(65) Prior Publication Data
US 2003/0192951 A1 Oct. 16, 2003

(30) Foreign Application Priority Data
Apr. 16, 2002 (KR) .......................................... 2002-20549

(51) Int. Cl.⁷ .............................................. G06K 19/06
(52) U.S. Cl. ........................ 235/494; 235/454; 235/472
(58) Field of Search ................................ 235/494, 454, 235/375, 472

(56) References Cited

U.S. PATENT DOCUMENTS

| | | | |
|---|---|---|---|
| 4,660,173 A | | 4/1987 | Mehdipour |
| 5,268,862 A | | 12/1993 | Rentzepis |
| 5,325,324 A | | 6/1994 | Rentzepis et al. |
| 5,450,218 A | | 9/1995 | Heanue et al. |
| 5,510,912 A | * | 4/1996 | Blaum et al. ................ 359/21 |
| 5,740,184 A | * | 4/1998 | Heanue et al. .............. 714/746 |
| 5,877,873 A | * | 3/1999 | Bashaw et al. .............. 359/10 |
| 5,940,537 A | * | 8/1999 | Regen et al. ............... 382/210 |
| 6,064,586 A | | 5/2000 | Snyder et al. |
| 6,414,296 B1 | * | 7/2002 | Edwards ................. 250/208.1 |
| 6,549,664 B1 | * | 4/2003 | Daiber et al. .............. 382/232 |
| 6,670,079 B1 | * | 12/2003 | Kitamura et al. .............. 430/1 |
| 2001/0055259 A1 | * | 12/2001 | Goto et al. .............. 369/59.17 |
| 2002/0051273 A1 | * | 5/2002 | Phua et al. ................. 359/200 |
| 2003/0039000 A1 | * | 2/2003 | Tanaka et al. ................ 359/22 |
| 2003/0039001 A1 | * | 2/2003 | King et al. ................... 359/35 |
| 2003/0044075 A1 | * | 3/2003 | Roh ......................... 382/235 |
| 2003/0151814 A1 | * | 8/2003 | Aspen ........................ 359/498 |

* cited by examiner

Primary Examiner—Jared J. Fureman
Assistant Examiner—Allyson N Trail
(74) Attorney, Agent, or Firm—Anderson Kill & Olick, PC

(57) ABSTRACT

A data input method is applied to a holographic digital data storage system in which sequential binary input data bits are arranged in an interleaved manner among pages. A first data bit is arranged in a specific position of a predetermined page, a second data bit is arranged in a specific position having similar beam intensity with that of the first data bit. Using this method, the holographic digital data storage system can be less affected by the adverse effect of spatial beam intensity variations and makes the entire data interleaved automatically to obtain more stable output data.

6 Claims, 2 Drawing Sheets

1st PAGE

2nd PAGE

Pth PAGE

DATA INPUT METHOD FOR A HOLOGRAPHIC DIGITAL DATA STORAGE SYSTEM

FIELD OF THE INVENTION

The present invention relates to a data input method; and, more particularly, to a data input method for a holographic digital data storage system, wherein hologram digital data are arranged in specific positions having similar beam intensity of each page in a storage medium.

BACKGROUND OF THE INVENTION

Recently, there have been reported increasing levels of research activities on holographic digital data storage systems triggered by the development of semiconductor lasers, e.g., charge coupled devices (CCDs) and the like. Since the holographic digital data storage system normally features a large storage capacity and a high data transfer rate, it has already been applied to, e.g., fingerprint recognition systems for storing and reproducing fingerprints and the scope of its applications keeps expanding.

The holographic digital data storage system allows a signal beam transmitted from an object to interfere with a reference beam and writes thus generated interference patterns on a storage medium made of, e.g., a photoreflective crystal or polymer which reacts to each pattern differently depending on the amplitude and phase of the interference pattern.

FIG. 1 depicts a block diagram of a holographic digital data storage system, which includes a light source 10, a beam splitter 20, two reflection mirrors 30 and 40, a spatial light modulator (SLM) 50, a storage medium 60, a CCD 70, a data arranging block 110 and a data extracting block 120.

The light source 10 generates a laser beam. The beam splitter 20 splits the laser beam into a reference beam and a signal beam and transfers the separated reference and signal beams along two different optical paths, wherein the reference beam and the signal beam correspond to a transmitted beam and a reflected beam, respectively.

The reference beam is reflected at the reflection mirror 30 so that the reflected reference beam is transferred to the storage medium 60. The signal beam, on the other hand, is reflected at the reflection mirror 40 so that the reflected signal beam is transferred to the SLM 50.

In the meantime, binary input data to be stored is arranged on a page basis at the data arranging block 110. The SLM 50 modulates the reflected signal beam with the arranged binary digital data for each page transferred from the data arranging block 110 to provide a modulated signal beam in the form of M×N binary pixel data for each page. The modulated signal beam is transferred to the storage medium 60 The reflection mirror 30 functions to change the reflection angle of the reflected reference beam by a small amount for data storage of different pages.

The interference pattern of the modulated signal beam interfering with the reference beam is stored in the storage medium 60.

When only the reference beam is irradiated onto the medium 60 in order to reconstruct the data written thereon, the reference beam is diffracted by the interference pattern stored in the storage medium 60 so that a check pattern corresponding to the M×N binary pixel data for each page may be restored. The check pattern is irradiated on the CCD 70 as restored data, which is then imaged by the CCD 70 and transferred to the data extracting block 120. In the data extracting block 120, the original data arranged at the data arranging block 110 is reconstructed from the restored data. The reference beam used for reproducing the data written in the storage medium 60 should be irradiated thereon at the same incident angle as that of the reference beam used in recording the data to be reproduced on the storage medium 60.

In the prior art data storage system described-above, the binary bits of the input data are recorded in the storage medium on the page-by-page basis. For example, assuming that each page to be stored is constituted by M×N binary pixels (i.e., M×N binary input data bits) as shown in FIG. 2, the binary input data bits to be stored are sequentially arranged at the data arranging block 110 in a zigzag scanning order along a column or a row direction in each page as shown in Table 1. That is, the first data bit is arranged at position (1,1) and the second data bit is arranged at (1,2) or (2,1) of the first page. If the second data bit is arranged at (1,2) for example, next data bits are arranged along the row direction, i.e., (1,3), (1,4), . . . , (1,N), (2,1), (2,2), . . . , (2,N), . . . , (M,1), (M,2), . . . , (M,N).

TABLE 1

| Data Number | Page Number | Input Coordinate |
| --- | --- | --- |
| 1 | 1 | (1,1) |
| 2 | 1 | (2,1) or (1,2) |
| 3 | 1 | (3,1) or (1,3) |
| 4 | 1 | (4,1) or (1,4) |
| ... | ... | ... |
| M×N+1 | 2 | (1,1) |
| M×N+2 | 2 | (2,1) or (1,2) |
| M×N+3 | 2 | (3,1) or (1,3) |
| ... | ... | ... |
| (P−1)×M×N+1 | P | (1,1) |
| (P−1)×M×N+2 | P | (2,1) or (1,2) |
| (P−1)×M×N+3 | P | (3,1) or (1,3) |
| ... | ... | ... |

The remaining input data are processed at the data arranging block 110 with respect to next pages in a manner described above. The data arranged based on the page basis is transferred to the SLM 50 and converted to the modulated signal beam in the form of binary pixels having "ON" or "OFF" images in accordance with the binary input data arranged at the data arranging block 110.

However, the conventional data arranging scheme described above suffers from certain drawbacks in that it is difficult to distinguish an "ON" state of pixel from an "OFF" state of pixel during the reproduction of the input data. Specifically, there normally is a large spatial variation across each page in the intensity of the modulated signal beam. That is, the light intensity is high at the central region thereof and decreases rather rapidly as proceeding toward the peripheral region thereof. Therefore, even a sequence of data consecutively written on a single column or row of a page can experience a large intensity variation in its "ON" pixel values (corresponding to binary "1" of the input data), rendering it difficult to identify an "ON" pixel and an "OFF" pixel in the reproduction process of the data.

For this reason, it would be desirable to provide a data input method for use in hologram digital data storage system capable of removing or reducing the adverse effect of a large spatial intensity variation of a light beam which complicates the reproduction process of the data in the system.

SUMMARY OF THE INVENTION

It is, therefore, an object of the present invention to provide a data input method capable of reducing reproduction errors of holographically stored digital data.

In accordance with a preferred embodiment of the present invention, there is provided a method for arranging input binary data bits among a plurality of pages to be stored in a holographic storage medium, each page including M×N storage positions, one data bit being arranged at one storage position, wherein an X number of sequential binary data bits are arranged among successive Q pages and at least one data bit is arranged in each of Q pages, M, N, X, Q being positive integer greater than 1 and X being greater than Q.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
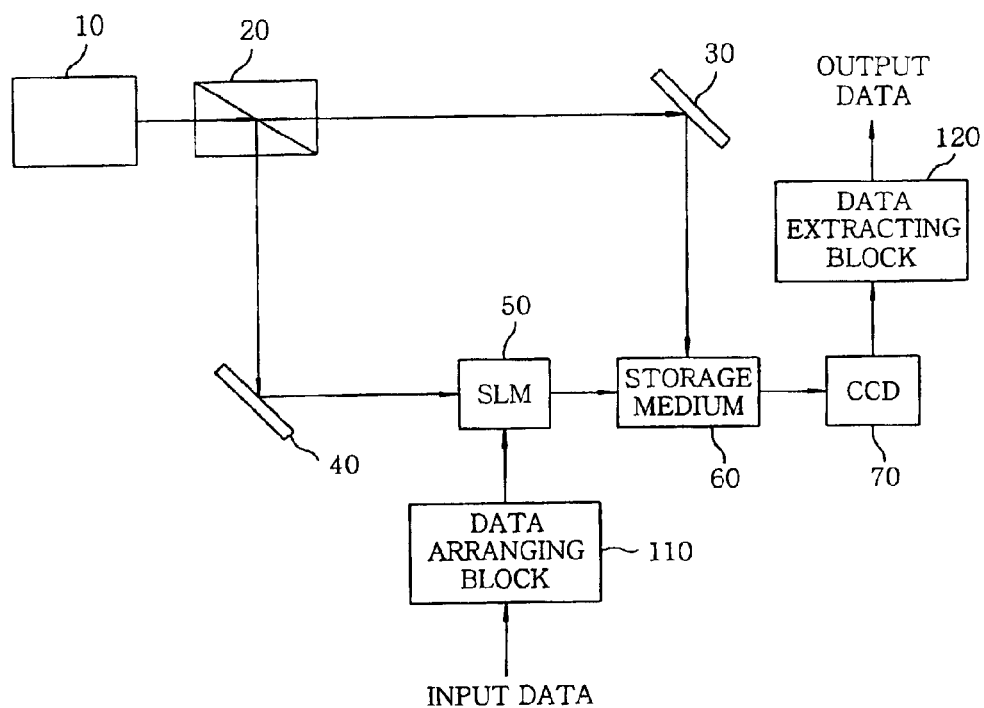
FIG. 1 illustrates a schematic view of a prior art holographic digital data storage system.
Figure 3:
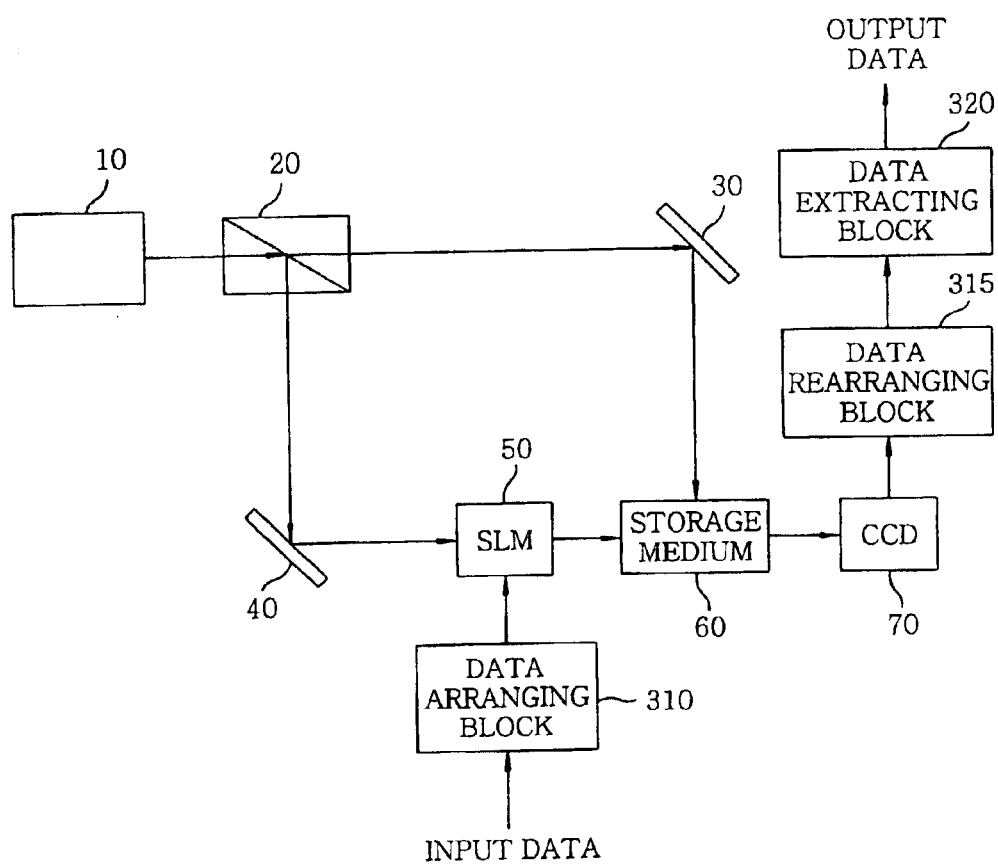
FIG. 3 shows a schematic view of a holographic digital data storage system in accordance with the present invention.

FIG. 3 shows a schematic view of a holographic digital storage system in accordance with an embodiment of the present invention, wherein like reference numerals are given for like parts as those of the prior art holographic digital data storage system shown in FIG. 1.

As shown in FIG. 3, the holographic digital data storage system includes a light source 10, a beam splitter 20, a first and a second mirror 30 and 40, an SLM 50, a storage medium 60, a CCD 70, a data arranging block 310, a data rearranging block 315 and a data extracting block 320. The light source 10, the beam splitter 20, the mirrors 30, 40, the SLM 50, the storage medium 60, and the CCD 70 function in analogous manners to those of the prior art hologram digital data storage system of FIG. 1, and therefore descriptions on the operations thereof will not be repeated.

Figure 2:
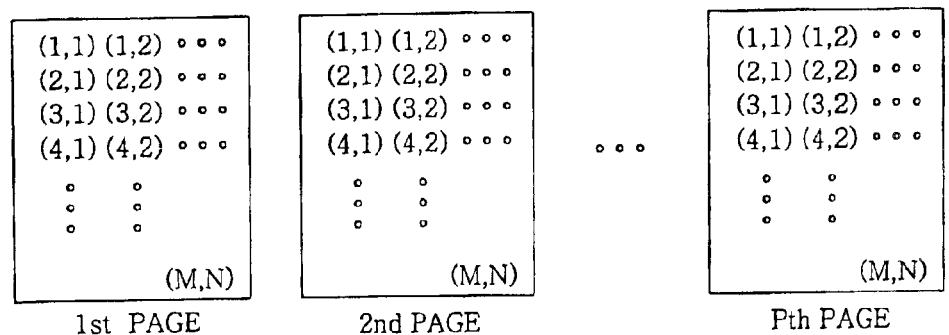
FIG. 2 exhibits an exemplary structure of data pages recorded in a storage medium of a holographic digital data storage system.

The data arranging block 310 arranges the sequential binary input data bits in a plurality of pages to be stored in the storage medium 60. It is assumed that each page is composed of M×N pixels, in other words, M×N data bits as shown in FIG. 2.

As described above, the beam intensity has a large spatial variation across each page, but temporal variation thereof is normally negligible compared with the spatial variation. Thus, the beam intensity can be regarded to have a similar distribution characteristics on each page. Accordingly, each page can be divided into plural pixel groups, each group having pixels with beam intensity variations less than a predetermined threshold value, and a corresponding pixel group in each page would have similar beam characteristics. The pixel groups can be predetermined before arranging data bits among pages. And also, it may be readily understandable that beam intensity at a same position in each page would be constant.

Thus, in accordance with a first preferred embodiment of the present invention, input data bits are interleaved among every Q pages as shown in Table 2, Q being an integer greater than 1. Specifically, a first data bit is arranged at (1,1) of a first page, a second data bit is arranged at (1,1) of a second page and so on, and a $Q_{th}$ data bit is arranged at (1,1) of a $Q_{th}$ page. In other word, first Q data bits are arranged at (1,1) of the Q pages, respectively. And then, $(Q+1)_{st}$ data bit is arranged at (2,1) or (1,2) of the first page again. If the $(Q+1)_{st}$ data bit is arranged at (1,2) of the first page, $(Q+2)_{nd}$ data bit is arranged at (1,2) of the second page. In this way, first (Q×M×N) data bits are arranged in first Q pages and $(Q×M×N+1)_{st}$ data bit is arranged at (1,1) of a $(Q+1)_{st}$ page. In such a manner, every (Q×M×N) data bit is arranged in every Q pages and the entire input data bits can be arranged among a multiplicity of pages on the page-by-page basis.

TABLE 2

| Data Number | Page Number | Input Position |
| --- | --- | --- |
| 1 | 1 | (1,1) |
| 2 | 2 | (1,1) |
| 3 | 3 | (1,1) |
| ... | ... | ... |
| Q | Q | (1,1) |
| Q+1 | 1 | (2,1) or (1,2) |
| Q+2 | 2 | (2,1) or (1,2) |
| ... | ... | ... |
| 2×Q | Q | (2,1) or (1,2) |
| 2×Q+1 | 1 | (3,1) or (1,3) |
| 2×Q+2 | 2 | (3,1) or (1.3) |
| ... | ... | ... |
| K×Q+1 | 1 | (K+1,1) or (1,K+1) |
| K×Q+2 | 2 | (K+1,1) or (1,K+1) |
| ... | ... | ... |

The bit arranging position sequence in each page may not be a zigzag order as in the first preferred embodiment. Knowing the beam intensity distribution in the page, each page can be filled by the input data bits, starting from a pixel position, e.g., a center pixel position, having a largest beam intensity, via a position of a second largest beam intensity and so on and finally ending at a pixel position of a lowest beam intensity.

In another preferred embodiment of the present invention, a bit arranging sequence among Q pages may not be consecutive. For instance, the input data bits can be arranged among Q pages in any sequence, e.g., $1_{st}$, $3_{rd}$, $2_{nd}$, $4_{th}$, ..., $Q_{th}$, $(Q-1)_{st}$ page, as long as the bit arranging page sequence is predetermined.

In still another embodiment of the present invention, the Q data bits may not be necessarily arranged at a same position of each of the Q pages, but they can be arranged in one of the pixel groups having similar beam intensity by using the above-described predetermined beam intensity characteristics, as long as the bit arranging position sequence is predetermined.

For example, if (1,1), (1,2) and (2,1) positions belong to a same pixel group, (3×Q) data bits can be arranged among those positions in Q pages in any predetermined sequence. For instance, the (3×Q) data bits can be arranged in an order of; (1,1) of first page, (1,2) of second page, (2,1) of third page, or the like. Alternatively, the successive three data bits can be arranged in a same page, for instance, the first 3 bits at one page and the second 3 bits at another page and so on, as long as the arranging sequence is predetermined. And also, if one pixel group in Q pages is filled with data, a pixel group to be used for next data bit arrangement can be a pixel group having preferably most similar beam intensity with the previously filled pixel group. Such arrangement of data bits can be performed with respect to the remaining pixel groups until bit arrangement among pages can be completed.

In still another preferred embodiment of the present invention, if binary differential coding is employed, the original data bits may be arranged in odd(even) number pages and the inverse data bits of the original data bits are arranged in even(odd) number pages. For example, if "ON" data is arranged in a specific position of the first page, "OFF" data is arranged in same position of the second page. This is effective when data is corrupted. Whole data of a damaged page can be restored by using a complement page thereof, even if one data page is totally destroyed.

The page based arranged data in accordance with the present invention is provided to the SLM 50 and processed with the reflected signal beam from the mirror 40.

In reproduction at the data rearranging block 315, the restored pixel data from the CCD 70 are rearranged to restore the original data bit sequence. And then, the rearranged pixel data from the data rearranging block 315 are transferred to the data extracting block 320. At the data extracting block 320, the "ON" or "OFF" states of pixels are converted into binary data bits to reconstruct the original input binary data. Various schemes for converting pixel data into binary data bits can be employed at the data extracting block 320. With any conversion scheme, the conversion process can be performed in a more stable manner and conversion errors can be reduced since data from the data rearranging block 315 suffers from less intensity variation.

The interleaving data arrangement scheme among different pages at positions having similar beam intensities in accordance with the present invention can be advantageously employed in obtaining stable output and the adverse effect of large spatial variation of the light beam can be removed or reduced. And also, when a large block of data is to be processed, data bits in such a large block are arranged and distributed into several pages, so that the block size in each page can be reduced and interleaving of data is automatically implemented.

While the invention has been shown and described with respect to the preferred embodiments, it will be understood by those skilled in the art that various changes and modifications may be made without departing from the spirit and scope of the invention as defined in the following claims.

What is claimed is:

1. A method for arranging input binary data bits among a plurality of pages to be stored in a holographic storage medium, each page including M×N storage positions, one data bit being arranged at one storage position, wherein an X number of sequential binary data bits are arranged among successive Q pages and at least one data bit is arranged in each of Q pages, M, N, X, Q being positive integers greater than 1 and X being greater than Q, wherein X=n×Q, with n being an integer smaller than M×N and n data bets are arranged in each of Q pages, wherein the X number of data bits are arranged on an m bits per page basis at a time, m being a positive integer not greater than n, wherein the X number of data bits are arranged at same positions in each page on an m bits per page basis at a time, and wherein the m corresponds to 1.

2. The method of claim 1, wherein the pages are consecutively sequenced.

3. The method of claim 2, wherein if a binary differential coding is employed, original data bits are arranged at a specific position of odd(even) number pages among Q pages and inverse data bits of original data bits are arranged at the same position corresponding to the original data bits in even(odd) number pages among Q pages.

4. A method for arranging input binary data bits among a plurality of pages to be stored in a holographic storage medium, each page including M×N storage positions, one data bit being arranged at one storage position, wherein an n×Q number of sequential binary data bits are arranged at same positions in each page among successive Q pages on an one bit per page basis at a time, n being an integer smaller than M×N and n data bits are arranged in each of Q pages, M, N, Q being positive integers greater than 1.

5. The method of claim 4, wherein the pages are sequenced consecutively.

6. The method of claim 5, wherein if a binary differential coding is employed, original data bits are arranged at a specific position of odd(even) number pages among Q pages and inverse data bits of original data bits are arranged at the same position corresponding to the original data bits in even(odd) number pages among Q pages.

* * * * *